United States Patent [19]

Bosman et al.

[11] Patent Number: 5,336,905

[45] Date of Patent: Aug. 9, 1994

[54] SEMICONDUCTOR DEVICE HAVING AN INSULATING SUBSTRATE AND SCHOTTKY DIODES

[75] Inventors: Antonie J. Bosman; Teunis J. Vink, both of Eindhoven; Richard C. van Dijk, Rotterdam; Frederikus R. J. Huisman, Eindhoven, all of Netherlands

[73] Assignee: U.S. Philips Corporation, New York, N.Y.

[21] Appl. No.: 907,423

[22] Filed: Jul. 1, 1992

[30] Foreign Application Priority Data

Jul. 4, 1991 [EP] European Pat. Off. ........ 91201724.1

[51] Int. Cl.⁵ ................... H01L 29/48; G02F 1/1343
[52] U.S. Cl. ......................... 257/54; 257/73; 257/452; 257/483; 359/60; 359/62
[58] Field of Search ................... 257/54, 73, 452, 483; 359/59

[56] References Cited

U.S. PATENT DOCUMENTS 4,952,984   8/1990   Martens et al. ..................... 257/73

*Primary Examiner*—Edward Wojciechowicz
*Attorney, Agent, or Firm*—Steven R. Biren

[57] ABSTRACT

Semiconductor device and method of manufacturing same, display device and support plate for same provided with such a semiconductor device. A semiconductor device having an insulating substrate on which a Schottky diode is formed between a metal layer and a semiconductor layer of polycrystalline or amorphous silicon extending over the metal layer is used inter alia in matrix display devices, such as LCDs. The Schottky diode forms part of a switching element of such a device and must have a low reverse current up to a reverse voltage of, for example, approximately 10 V. The known semiconductor device having Schottky diodes, in which the semiconductor material extends over a lateral surface of the Schottky metal, is found not to comply with this requirement. To overcome this deficiency a low leakage current is realized over a wide reverse voltage range due to the presence of a dielectric on the lateral surface of the Schottky metal. The dielectric suppresses the leakage current issuing from the lateral surface. Preferably, the dielectric includes an oxide of the Schottky metal. This may be readily formed through local oxidation, for example, by means of an oxygen plasma.

6 Claims, 3 Drawing Sheets

SEMICONDUCTOR DEVICE HAVING AN INSULATING SUBSTRATE AND SCHOTTKY DIODES

BACKGROUND OF THE INVENTION

The invention relates to a semiconductor device having an insulating substrate and comprising at least one Schottky diode which is formed between a metal layer situated on the substrate and a semiconductor layer of polycrystalline or amorphous silicon which lies partly on the metal layer and which extends partly outside the metal layer over a lateral surface of the metal layer. The invention also relates to a method of manufacturing such a device and to a display device and a support plate for this device comprising such a semiconductor device.

Such a semiconductor device is suitable inter alia for use in a display device for displaying alphanumerical and video information by means of passive electro-optical display media such as liquid crystals, electrophoretic suspensions, and electrochromic materials.

A semiconductor device of the kind mentioned in the opening paragraph is known from British Patent Application 2,129,183, in particular from FIG. 27 and the corresponding part of the description on pp. 6 and 7 of the said Patent Application. A semiconductor device is described therein which forms part of a matrix display device with switching elements comprising a Schottky diode which is formed between a metal layer situated on an insulating substrate and a semiconductor layer of polycrystalline or amorphous silicon which extends over the metal layer, overlapping the latter. The use of such a semiconductor device has many advantages, among them a simple manufacture and a low crosstalk. It is further noted in the British Patent Application that the lateral leakage current path, which occurs in a semiconductor device having a PIN diode overlapping the subjacent metal, is absent in a device having a Schottky diode, so that the leakage current in the reverse direction is lower.

A disadvantage of the known semiconductor device is that the Schottky diodes therein still turn out to have a high reverse current. In addition, as practice has shown, the reverse current strongly increases especially at reverse voltages across the diode of 2 to 10 Volts. As a result, the known semiconductor device is less suitable for use in a matrix display device since the reverse voltages usual in such devices, which are above 2 Volts, cause the charge with which the corresponding picture element is kept at the desired voltage to flow away prematurely.

SUMMARY OF THE INVENTION

The invention has for its object inter alia to counteract the drawbacks of the comparatively high leakage current, which increases strongly with increasing reverse voltage, and to provide a semiconductor device whose Schottky diode has a better current-reverse voltage characteristic, while it is also easy to manufacture. The invention also has for its object to provide a simple method of manufacturing a semiconductor device according to the invention.

According to the invention, a semiconductor device of the kind mentioned in the opening paragraph is characterized in that the lateral surface of the metal layer is separated from the semiconductor layer by a dielectric. It was surprisingly found that the leakage current of such a semiconductor device is much lower than the leakage current of a device in which the semiconductor layer is in direct contact with the lateral surface of the metal layer. The reduction of the leakage current, which is especially strong for higher reverse voltages (from 2 Volts upwards), is observed even when the thickness of the dielectric is comparatively small, for example, approximately 10 Å. The lateral surface of the metal layer is not always electrically insulated from the semiconductor layer with this thickness of the dielectric. The thickness of the dielectric, and thus the distance between the lateral surface of the metal layer and the semiconductor layer is also allowed to be (much) greater than the value given above. In that case, subject to the resistance and breakdown voltage of the dielectric, the lateral surface of the metal layer is electrically insulated from the semiconductor layer. Consequently, the lateral surface of the metal layer no longer forms part of the Schottky diode and any edge effects, such as an increase of the field strength accompanied by an increase in leakage current or breakdown, are avoided or at any rate reduced. The dielectric may comprise, for example, silicon dioxide or silicon nitride and be provided as a so-called spacer. The semiconductor device according to the invention is highly suitable for use in a matrix display device such as an LCD (=Liquid Crystal Display) since the picture elements of the LCD can be satisfactorily held at the desired voltage thereby.

An important embodiment of a semiconductor device according to the invention is characterized in that the dielectric comprises an oxide of a metal which forms part of the metal layer. This simplifies the manufacture of a semiconductor device according to the invention, because no separate deposition step is necessary for providing the dielectric, it being sufficient to bring the lateral surface into contact with an oxidant. Preferably, the lateral surface of the metal layer provided with a dielectric is formed so as to be oblique relative to the substrate. This increases the accessibility of the lateral surface to the oxidant. In addition, a good step covering is obtained during the provision of the semiconductor layer thanks to the oblique lateral surface. The best results are obtained when the acute angle enclosed by the lateral surface of the metal layer and the portion of the substrate situated below the metal layer is between 20° and 90°. Hydrogenated amorphous silicon is preferably used as the semiconductor material. Layers of tungsten or molybdenum form suitable metal layers. The thickness of the dielectric is preferably at least approximately 20 Å.

According to the invention, a method of manufacturing a semiconductor device according to the invention, whereby a metal layer is provided on an insulating substrate, subsequently a semiconductor layer is provided over the metal layer so as to be partly within and partly outside the metal layer seen in projection, and whereby the semiconductor layer extends over a lateral surface of the metal layer, is characterized in that the lateral surface of the metal layer is provided with a dielectric before the semiconductor layer is provided. In such a method, for example, a layer of silicon dioxide is provided over the metal layer, after which the silicon dioxide is removed again on and next to the metal layer by etching back, while it remains intact against a lateral surface of the metal layer in the form of a so-called spacer. A semiconductor device according to the invention is obtained in a simple manner by a method according to the invention.

A first and important embodiment of a method according to the invention is characterized in that a first mask is provided on the metal layer, after which the portion of the metal layer situated outside the first mask is removed by etching, after which, before or after removal of the first mask, the lateral surface of the metal layer is provided with a dielectric, after which, the first mask being removed, the semiconductor layer is provided over the metal layer, on which assembly a second mask is provided which, seen in projection, is intersected by the lateral surface, and subsequently the portion of the semiconductor layer situated outside the second mask is removed by etching, after which the second mask is removed. In a preferred modification of this embodiment, the dielectric is formed through oxidation of the lateral surface of the metal layer. No extra deposition step is necessary as a result, but only an oxidation step in which the lateral surface of the metal layer is brought into contact with an oxidant. This makes for a simple manufacture. When the oxidation step is performed before the removal of the first mask, the lateral surface only of the metal layer is oxidized. The provision of the dielectric is further simplified by this. When an oxygen plasma is used as the oxidant, the manufacture is rendered even simpler, since plasma equipment is often on standby already, inter alia for etching metal or semiconductor layers or for removing photoresist. The oxidation step, however, may alternatively take place after the removal of the first mask. If the dielectric formed is thin enough, for example approximately 20 Å, this does not adversely affect the Schottky diode formed between the metal layer and the semiconductor layer, and the entire metal layer is allowed to remain covered by the dielectric.

A preferred embodiment of a method according to the invention is characterized in that the lateral surface of the metal layer is formed so as to be oblique relative to the substrate. As a result, the lateral surface is very well accessible to an oxidant. This is of particular importance when the oxygen plasma referred to above is used as the oxidant. This is because such a plasma is hardly active in the lateral direction, so that substantially no oxide will be formed on such a lateral surface if this lateral surface of the metal layer is perpendicular to the substrate, which is undesirable. When plasma etching is used for etching of the metal layer, both etching of the metal layer and forming of the dielectric on the lateral surface thereof may be carried out by means of an oxygen plasma in one and the same arrangement and in immediate succession, which simplifies the manufacture. If the mask used for etching and oxidizing comprises photoresist, this mask may be removed in the same arrangement, after etching and before or after oxidizing. During plasma etching of the metal layer, the so-called photoresist erosion technology is preferably used for obtaining a lateral surface which is oblique relative to the substrate. It was found that plasma etching of the metal layers for which usual gas mixtures comprising freon and oxygen or freon and sulphur hexafluoride are used results in comparatively steep, ragged and rough lateral surfaces. Surprisingly, the use of gas mixtures of sulphur hexafluoride and oxygen results in very oblique, smooth, and non-ragged lateral surfaces. Such a gas mixture, therefore, is eminently suitable for plasma etching of the metal layer in a semiconductor device according to the invention. When the oxygen content in such a mixture is raised from 40 to 70%, an angle of the lateral surface of the metal layer is observed which changes from approximately 90 degrees to approximately 20 degrees.

BRIEF DESCRIPTION OF THE DRAWING

The invention will now be described with reference to an embodiment and the drawing, in which.

Figure 1:
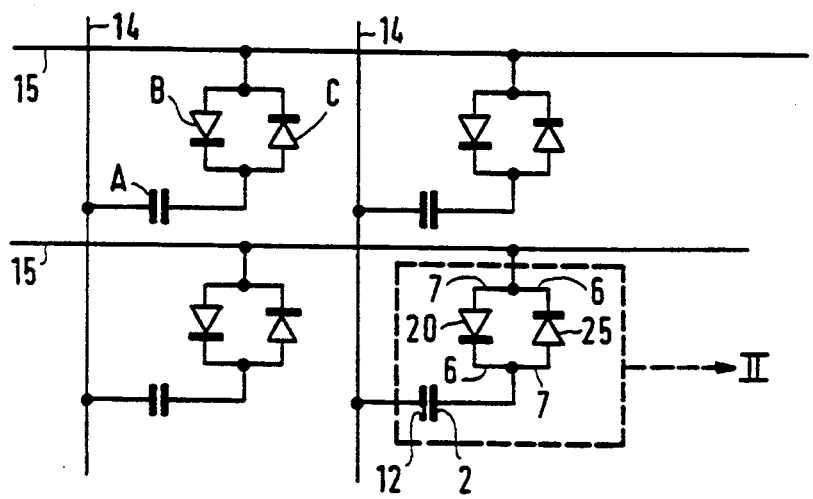
FIG. 1 diagrammatically shows a drive circuit of a portion of a display device comprising a semiconductor device according to the invention.

The Figures are diagrammatical and not drawn to scale, the dimensions in the thickness direction being particularly exaggerated for greater clarity. Corresponding parts are given the same reference numerals as a rule. Semiconductor regions of the same conductivity type are generally hatched in the same direction in the cross-sections.

DESCRIPTION OF THE PREFERRED EMBODIMENTS

FIG. 1 diagrammatically shows a drive diagram of a portion of a display device comprising a semiconductor device according to the invention. This portion comprises row electrodes 15 and column electrodes 14 between which picture elements A are arranged. Two Schottky diodes B and C which together form a switching element are connected in anti-parallel between a picture element A and a row electrode 15. These diodes comprise semiconductor bodies 20 and 25, respectively, which are connected to a row electrode 15 and—via the picture element A which comprises two picture electrodes 2 and 12—to a column electrode 14 by means of conducting layers 6 and 7.

Figure 2:
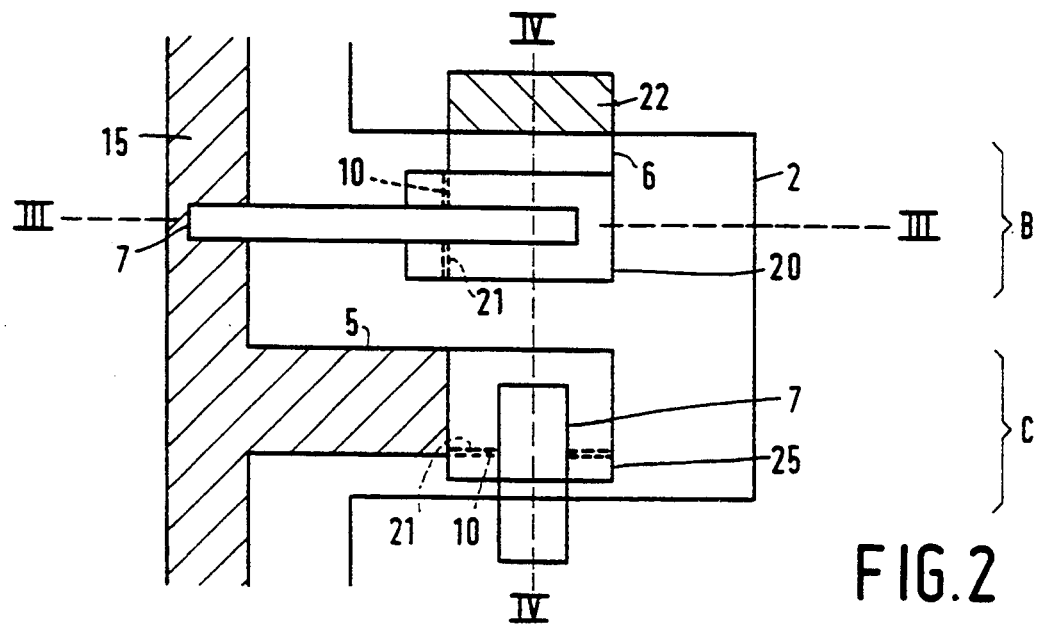
FIG. 2 is a diagrammatic plan view of the portion of a display device comprising a semiconductor device according to the invention situated inside the broken lines indicated with II in FIG. 1.

FIG. 2 diagrammatically shows in plan view the portion of the display device situated inside the broken lines indicated with II in FIG. 1, this display device comprising two support plates situated one above the other. For the sake of clarity, the upper support plate, on which inter alia the column electrodes 14 and the picture electrodes 12 are present, has been left out in this Figure, which only shows a plan view of the lower support plate which comprises a semiconductor device according to the invention. On this latter support plate are present a row electrode 15, a picture electrode 2 of the picture element A, and the diodes B and C comprising respective semiconductor bodies 20 and 25. The semiconductor body 20 forms a Schottky diode at the lower side with a metal layer 6 which extends over the picture electrode 2 within a region 22 and is connected at the upper side to the row electrode 15 via a metal layer 7. The semiconductor body 25 forms a Schottky diode at the lower side with a metal layer 5 which is connected to the row electrode 15, and is connected to the picture electrode 2 at the upper side via metal layer 7. The diodes B and C are thus connected in anti-parallel. The lateral dimensions of the mesa-shaped semiconductor bodies 20 and 25 are approximately 20×30 μm. The metal layer 5, 6 is made of tungsten here and has a thickness of approximately 0.2 μm. The metal layer 7, which is made of chromium, and the picture electrode 2 which comprises indium-tin oxide (ITO) have a usual thickness.

Figure 3:
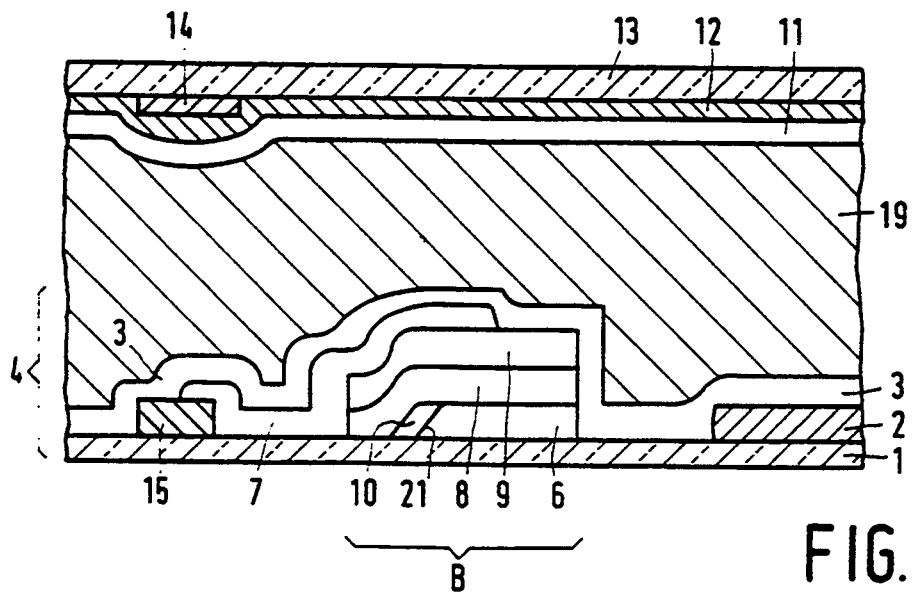
FIGS. 3 and 4 are diagrammatic cross-sections taken on the lines III—III and IV—IV in FIG. 2, respectively, of the display device comprising a semiconductor device according to the invention.
Figure 4:
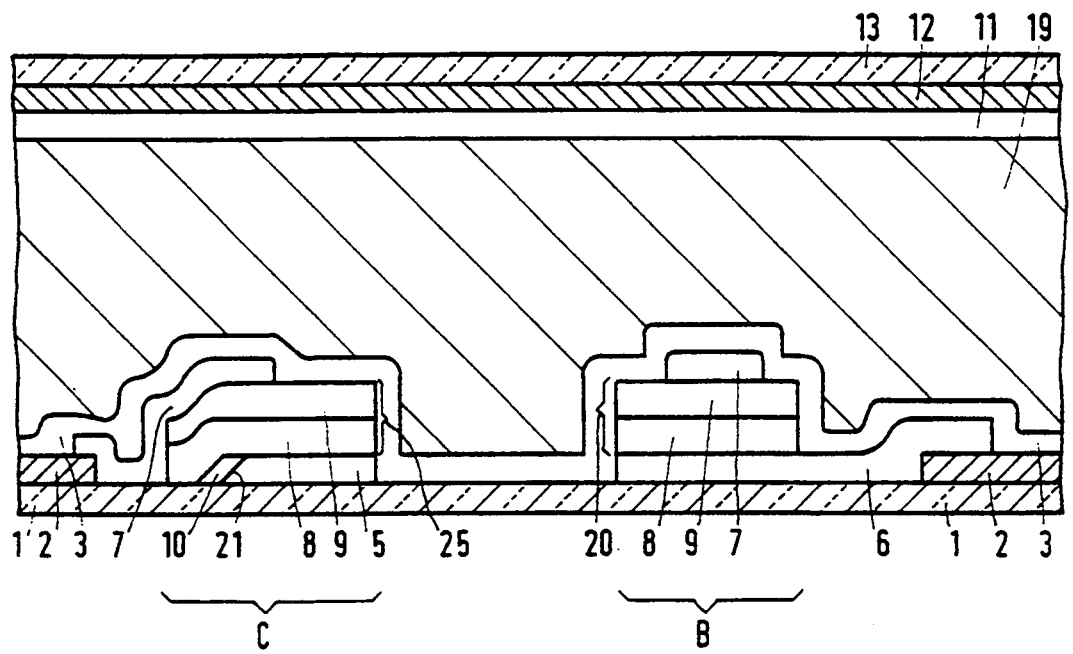
Figure 5:
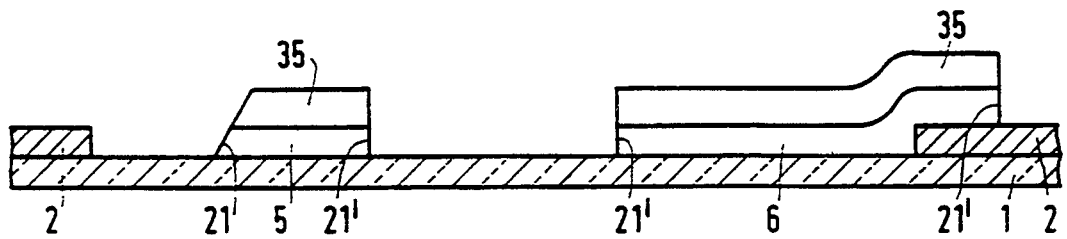
FIGS. 5 to 9 show the display device of FIG. 2 diagrammatically in cross-section taken on the line IV—IV and in subsequent stages of manufacture of the semiconductor device according to the invention by a method according to the invention.
Figure 6:
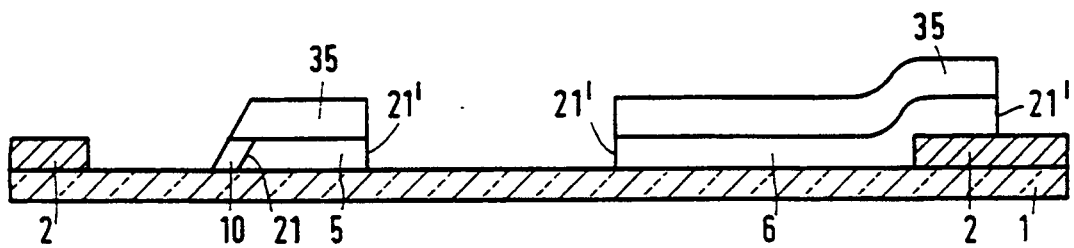
Figure 7:
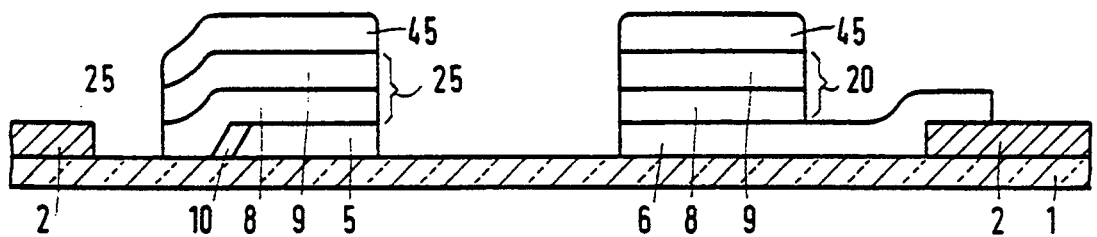
Figure 8:
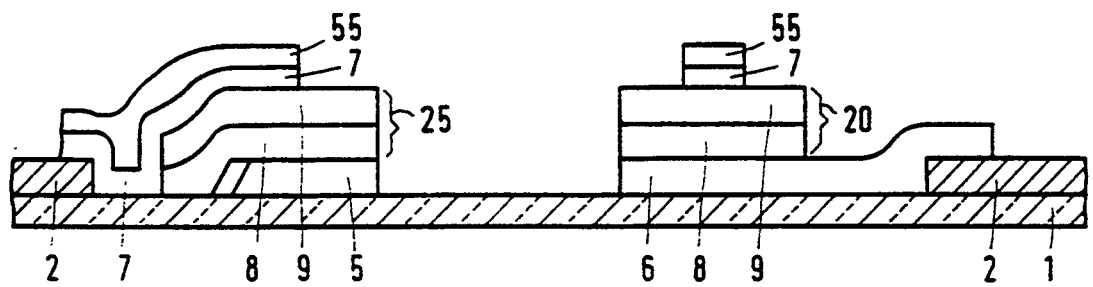
Figure 9:
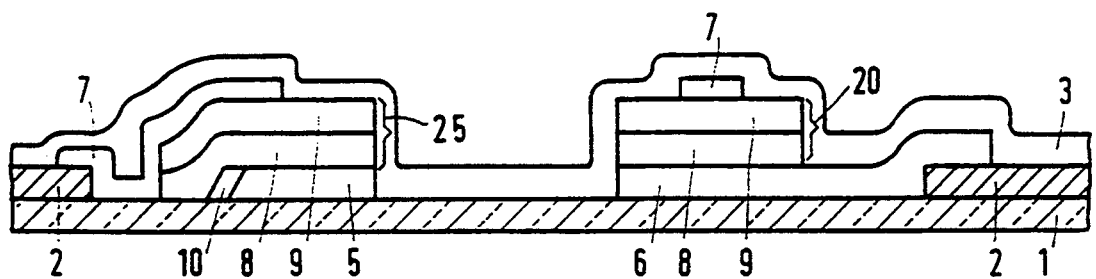

FIGS. 3 and 4 diagrammatically show cross-sections taken on the lines III—III and IV—IV in FIG. 2 of a display device comprising a semiconductor device according to the invention. The semiconductor device 4 comprises (see FIGS. 3 and 4) an insulating substrate 1 which serves as a support plate for the display device, made of glass in this case, on which a row electrode 15 and a picture electrode 2 are present. The semiconductor device furthermore comprises at least one Schottky diode, here two diodes B and C, which is formed between a metal layer 5, 6, here two tungsten metal layers, which is present on the substrate 1 and a semiconductor layer 8 of polycrystalline or amorphous silicon, here of hydrogenated amorphous silicon, which is present partly on the metal layer 5, 6 and extends partly outside the metal layer 5, 6 over a lateral surface 21 of the metal layer 5, 6. According to the invention, the lateral surface 21 of the metal layer 5, 6 is separated from the semiconductor layer 8 by a dielectric 10. It is found that the leakage current of the Schottky diode B, C is considerably reduced by this compared with the situation in which the semiconductor layer is in direct contact with the lateral surface 21 of the metal layer 5, 6. In this example, a further, more highly doped semiconductor layer is present on the semiconductor layer 8, on which further layer a metal layer 7 made of chromium is present which forms an ohmic contact with the further semiconductor layer 9. The thickness of the dielectric 10 is preferably at least 10 Å. Preferably, as in the present example, the dielectric 10 comprises an oxide of a metal which forms part of the metal layer 5, 6, so in this case a tungsten oxide. The favorable effect of the dielectric 10 is apparent from the following: a leakage current which increased from approximately $5 \times 13^{-13}$ A to approximately $1.5 \times 10^{-8}$ A with reverse voltages from 2 to 10 Volts was observed in a semiconductor device without a dielectric 10, whereas in a semiconductor device according to the invention at the same voltages a leakage current from approximately $5 \times 10^{-13}$ A to approximately $2 \times 10^{-11}$ A was observed. The leakage current is reduced by a factor of one thousand owing to the presence of the dielectric 10 on the lateral surface 21. The manufacture of the semiconductor device in this preferred embodiment is also very simple, since instead of a deposition of a dielectric 10 it is sufficient to expose the metal layer 5, 6 to an oxidant. Preferably, the lateral surface 21 of the metal layer 5, 6 is oblique relative to the insulating substrate 1, as in the present example. As a result, the lateral surface 21 can be readily exposed to an oxidant and a good step covering is obtained when the semiconductor layer 8 is provided on the metal layer 5, 6. The best results are obtained when the acute angle enclosed by the lateral surface 21 and the portion of the insulating substrate 1 situated below the diodes B and C is between 20 and 90 degrees. In this example, the semiconductor layer 8 is undoped and has a thickness of approximately 0.5 μm, while the semiconductor 9 is of the n-conductivity type, has a doping level of approximately $5 \times 10^{20}$ at/cm$^3$ and has a thickness of approximately 0.1 μm. The semiconductor device is coated with a first orientation layer 4 which comprises, for example, polyimide. The display device in the present example further comprises a second support plate 13, also of glass here, on which a cup electrode 14, made of, for example, gold, chromium or aluminum, here of chromium, is present, as well as a picture electrode 12 of ITO. A second orientation layer 11, also of polyimide, is provided over this. Between the support plates 1 and 13 there is a layer 19 which comprises liquid crystals in the present case.

FIGS. 5 to 9 show the display device of FIG. 2 with a semiconductor device according to the invention diagrammatically in cross-section taken on the line IV—IV and in successive stages of manufacture of the semiconductor device by means of a method according to the invention. A method of manufacturing a semiconductor device according to the invention comprises inter alia the following steps: the provision of a metal layer 5, 6 on an insulating substrate 1 and the subsequent provision of a semiconductor layer 8 over the metal layer 5, 6 in such a way that the former extends over a lateral surface 21 of the metal layer 5, 6. According to the invention, the lateral surface 21 is provided with a dielectric 10 before the semiconductor layer 8 is provided. In this example, the method comprises the following steps: a layer 2 comprising ITO is provided in pattern on an insulating substrate 1, here made of glass, after which a metal layer 5, 6, here made of tungsten, is provided (see FIG. 5). A pattern is etched in this metal layer by means of plasma etching with a first photoresist mask 35, a lateral surface 21 of the metal layer 5, 6 being formed so as to be oblique. The so-called photoresist erosion technology is used for this. Then, according to the invention, the lateral surface 21 of the metal layer 5, 6 is provided with a dielectric 10 (see FIG. 6), preferably through the formation of a metal oxide of a metal which forms part of the metal layer 5, 6. In this example the dielectric 10 is formed by oxidation of the metal layer 5, 6, a tungsten oxide being formed. Thanks to the presence of the first mask 35, the upper side of the metal layer 5, 6 is not oxidized. Preferably, an oxygen plasma is used for the oxidation, so that the formation of the dielectric 10 may take place in the same equipment in which the metal layer 5, 6 is etched. During etching of the metal layer 5, 6, the lateral surface 21 is preferably shaped obliquely, so that it is uniformly coated with a dielectric 10 of sufficient thickness during the treatment with the oxygen plasma. A good step covering is obtained owing to the obliqueness of the lateral surface 21 during the provision of further layers over the metal layer 5, 6. The lateral surfaces 21' are also shaped obliquely and provided with a dielectric 10 upon exposure to the oxygen plasma, which is not relevant to the invention, however, and is not represented in the Figures for simplicity's sake. Subsequently, the mask 35 is removed, also by means of plasma etching. Preferably, etching of the metal layer 5, 6, forming of the dielectric 10, and removal of the first mask 35 are carried out in the same plasma device. When the dielectric 10 is provided after the removal of the first mask 35, this dielectric 10 need not be removed from the upper side of the metal layer 5, 6, provided the dielectric 10 is sufficiently thin. The portion of the dielectric 10 dielectric 10 present on the upper side of the metal layer 5, 6 then does not adversely affect the (forward bias) characteristics of the Schottky diodes B, C. After this (see FIG. 7), the semiconductor layer 8 of amorphous hydrogenated silicon, which is undoped, has a thickness of approximately 0.5 μm, and forms a Schottky junction with the metal layer 5, 6, is provided over the metal layer 5, 6. In this example, a further semiconductor layer 9, also of amorphous hydrogenated silicon, is then provided. This layer is of the n-conductivity type and has a doping concentration of approximately $5 \times 10^{20}$ at/cm$^3$ and a thickness of approximately 0.1 µm. Then a second mask 45, which is intersected by the dielectric 10, seen in projection, is provided on the further semiconductor layer 9. After this, the mesa-shaped semiconductor bodies 20 and 25 are formed through etching. After removal of the second mask 45 (see FIG. 8), a metal layer, made of chromium here, is provided in pattern over the resulting semiconductor device by means of a third mask 55, which metal layer forms an ohmic contact with the semiconductor layer 9. After removal of the third mask 55 (see FIG. 9), the resulting semiconductor device is coated with an orientation layer 3 of polyimide and forms the first support plate of the display device of this example, which also comprises a second support plate 13 and a layer 19 of liquid crystals, as shown in FIGS. 3 and 4. As was noted above, an oblique lateral surface 21 is of major importance for an effective formation of the dielectric 10 by means of an oxygen plasma. It was surprisingly found that oblique and at the same time very plane, non-ragged lateral surfaces 21 are formed with a plasma of a gas mixture comprising sulphur hexafluoride and oxygen. When the oxygen content of the gas mixture is chosen to lie between 40 and 70%, a lateral surface 21 is obtained which encloses an angle of between 90 and 20 degrees with the substrate 1.

It is noted that, besides the drive diagram used for the display device of the example, alternative drive diagrams with a different circuit of Schottky diodes may be used. Thus the advantage of the use of a semiconductor device comprising Schottky diodes having a low reverse current is even greater when a drive diagram is used as described in the Netherlands Patent Application no. 8502663, published on Apr. 16, 1978.

It is further noted that a semiconductor device according to the invention may be used to advantage not only in matrix display devices, but also in other semiconductor devices, such as semiconductor memories constructed in polycrystalline or amorphous silicon, or semiconductor imaging devices. It will also be evident that the invention relates to a method of manufacturing a support plate for a display device.

We claim:

1. A semiconductor device having an insulating substrate and comprising at least one Schottky diode which is formed between a metal layer situated on the substrate and a semiconductor layer of one of polycrystalline and amorphous silicon which lies partly on the metal layer and which extends partly outside the metal layer over a lateral surface of the metal layer, characterized in that the lateral surface of the metal layer is separated from the semiconductor layer by a dielectric.

2. A semiconductor device as claimed in claim 1, characterized in that the dielectric comprises an oxide of a metal which forms part of the metal layer.

3. A semiconductor device as claimed in claim 1 or 2, characterized in that the lateral surface of the metal layer is positioned obliquely relative to the insulating substrate.

4. A semiconductor device as claimed in claim 3, characterized in that the acute angle enclosed by the lateral surface of the metal layer and the portion of the insulating the substrate situated below the metal layer is between 20° and 90°.

5. A display device comprising an electro-optical display medium between two support plates, a system of picture elements arranged in rows and columns, each picture element being formed by two mutually-facing surfaces of picture electrodes provided on the support plates, a system of row and column electrodes for driving the picture elements, the row electrodes being provided on one of said support plates and the column electrodes on the other of said support plates, and a system of switching elements, a switching element being connected between at least one row and one column electrode in series with each picture element, which picture elements comprise at least one Schottky diode, characterized in that at least one support plate comprises a semiconductor device as claimed in claim 1 or 2.

6. A support plate suitable for use in a display device as claimed in claim 5.

* * * * *